United States Patent
Duffy et al.

(10) Patent No.: US 10,127,653 B2
(45) Date of Patent: Nov. 13, 2018

(54) DETERMINING COORDINATES FOR AN AREA OF INTEREST ON A SPECIMEN

(71) Applicant: KLA-Tencor Corporation, Milpitas, CA (US)

(72) Inventors: Brian Duffy, San Jose, CA (US); Michael Lennek, San Jose, CA (US); ChangHo Lee, Kyonggi do (KR)

(73) Assignee: KLA-Tencor Corp., Milpitas, CA (US)

( * ) Notice: Subject to any disclaimer, the term of this patent is extended or adjusted under 35 U.S.C. 154(b) by 370 days.

(21) Appl. No.: 14/804,102

(22) Filed: Jul. 20, 2015

(65) Prior Publication Data
US 2016/0027164 A1 Jan. 28, 2016

Related U.S. Application Data

(60) Provisional application No. 62/027,402, filed on Jul. 22, 2014, provisional application No. 62/163,325, filed on May 18, 2015.

(51) Int. Cl.
*G06T 7/00* (2017.01)
*G06T 5/50* (2006.01)
*G06T 7/32* (2017.01)

(52) U.S. Cl.
CPC ............... *G06T 7/001* (2013.01); *G06T 5/50* (2013.01); *G06T 7/32* (2017.01);
(Continued)

(58) Field of Classification Search
CPC . G06T 7/001; G06T 2207/20164; G06T 7/32; G06F 17/5068; G06K 9/6202
See application file for complete search history.

(56) References Cited

U.S. PATENT DOCUMENTS 5,272,501 A * 12/1993 Nishi ............... G03F 9/7049
355/43
5,525,808 A * 6/1996 Irie ................ G03F 9/7003
250/548
(Continued)

FOREIGN PATENT DOCUMENTS

WO     2008/070772     6/2008

OTHER PUBLICATIONS

International Search Report for PCT/US2015/041607 dated Dec. 31, 2015.
U.S. Appl. No. 62/073,418, filed Oct. 31, 2015 by Duffy.

*Primary Examiner* — Iman K Kholdebarin
*Assistant Examiner* — Mai Tran
(74) *Attorney, Agent, or Firm* — Ann Marie Mewherter

(57) ABSTRACT

Methods and systems for determining coordinates for an area of interest on a specimen are provided. One system includes one or more computer subsystems configured for, for an area of interest on a specimen being inspected, identifying one or more targets located closest to the area of interest. The computer subsystem(s) are also configured for aligning one or more images for the one or more targets to a reference for the specimen. The image(s) for the target(s) and an image for the area of interest are acquired by an inspection subsystem during inspection of the specimen. The computer subsystem(s) are further configured for determining an offset between the image(s) for the target(s) and the reference based on results of the aligning and determining modified coordinates of the area of interest based on the offset and coordinates of the area of interest reported by the inspection subsystem.

30 Claims, 5 Drawing Sheets

(52) U.S. Cl.
CPC ............... *G06T 2207/10004* (2013.01); *G06T 2207/20164* (2013.01); *G06T 2207/30148* (2013.01)

(56) References Cited

U.S. PATENT DOCUMENTS

| | | | |
|---|---|---|---|
| 5,742,067 A * | 4/1998 | Imai | G03F 7/70358 250/548 |
| 5,792,580 A * | 8/1998 | Tomimatu | G03F 7/70425 430/22 |
| 7,570,796 B2 | 8/2009 | Zafar et al. | |
| 7,676,077 B2 * | 3/2010 | Kulkarni | G06F 17/5045 382/144 |
| 8,041,103 B2 | 10/2011 | Kulkarni et al. | |
| 8,045,785 B2 * | 10/2011 | Kitamura | G06K 9/00 348/125 |
| 8,126,255 B2 | 2/2012 | Bhaskar et al. | |
| 8,139,843 B2 | 3/2012 | Kulkarni et al. | |
| 8,611,639 B2 | 12/2013 | Kulkarni et al. | |
| 8,664,594 B1 | 4/2014 | Jiang et al. | |
| 8,692,204 B2 | 4/2014 | Kojima et al. | |
| 8,698,093 B1 | 4/2014 | Gubbens et al. | |
| 8,716,662 B1 | 5/2014 | MacDonald et al. | |
| 9,183,624 B2 | 11/2015 | Karsenti et al. | |
| 2003/0156749 A1* | 8/2003 | Nishiura | G06T 7/0004 382/149 |
| 2003/0160627 A1* | 8/2003 | Muradian | G01N 21/95607 702/117 |
| 2006/0215900 A1* | 9/2006 | Oaki | G06K 9/03 382/145 |
| 2007/0133860 A1* | 6/2007 | Lin | G06T 7/001 382/149 |
| 2007/0288219 A1* | 12/2007 | Zafar | G03F 1/84 703/14 |
| 2008/0163140 A1* | 7/2008 | Fouquet | G03F 1/84 700/110 |
| 2009/0074286 A1* | 3/2009 | Kitazawa | G01N 21/9501 382/144 |
| 2009/0268959 A1* | 10/2009 | Harada | G06T 7/001 382/149 |
| 2011/0170091 A1* | 7/2011 | Chang | G01N 21/9501 356/237.5 |
| 2011/0310241 A1 | 12/2011 | Postolov | |
| 2013/0064442 A1* | 3/2013 | Chang | G06T 7/001 382/149 |
| 2014/0105482 A1* | 4/2014 | Wu | G06T 7/001 382/149 |
| 2014/0198975 A1* | 7/2014 | Nakagaki | G01N 23/2251 382/149 |
| 2014/0241610 A1 | 8/2014 | Duffy et al. | |
| 2014/0333848 A1* | 11/2014 | Chen | G06F 3/041 349/12 |
| 2014/0376801 A1 | 12/2014 | Karsenti et al. | |
| 2015/0012900 A1 | 1/2015 | Shifrin | |
| 2016/0025648 A1 | 1/2016 | Duffy et al. | |
| 2016/0027164 A1* | 1/2016 | Duffy | G06T 5/50 382/151 |

* cited by examiner

DETERMINING COORDINATES FOR AN AREA OF INTEREST ON A SPECIMEN

BACKGROUND OF THE INVENTION

1. Field of the Invention

The present invention generally relates to methods and systems for determining coordinates for an area of interest on a specimen.

2. Description of the Related Art

The following description and examples are not admitted to be prior art by virtue of their inclusion in this section.

An integrated circuit (IC) design may be developed using a method or system such as electronic design automation (EDA), computer aided design (CAD), and other IC design software. Such methods and systems may be used to generate the circuit pattern database from the IC design. The circuit pattern database includes data representing a plurality of layouts for various layers of the IC. Data in the circuit pattern database may be used to determine layouts for a plurality of reticles. A layout of a reticle generally includes a plurality of polygons that define features in a pattern on the reticle. Each reticle is used to fabricate one of the various layers of the IC. The layers of the IC may include, for example, a junction pattern in a semiconductor substrate, a gate dielectric pattern, a gate electrode pattern, a contact pattern in an interlevel dielectric, and an interconnect pattern on a metallization layer.

The term "design data" as used herein generally refers to the physical design (layout) of an IC and data derived from the physical design through complex simulation or simple geometric and Boolean operations.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail.

As design rules shrink, however, semiconductor manufacturing processes may be operating closer to the limitations on the performance capability of the processes. In addition, smaller defects can have an impact on the electrical parameters of the device as the design rules shrink, which drives more sensitive inspections. Therefore, as design rules shrink, the population of potentially yield relevant defects detected by inspection grows dramatically, and the population of nuisance defects detected by inspection also increases dramatically. Therefore, more and more defects may be detected on the wafers, and correcting the processes to eliminate all of the defects may be difficult and expensive.

Recently, inspection systems and methods are increasingly being designed to focus on the relationship between defect and design since it is the impact on the design for a wafer that will determine whether and how much a defect matters. For example, some methods have been developed for aligning inspection and design coordinates. One such method depends on the accuracy of the inspection system coordinate registration to design. Another such method involves conducting post-processing alignment on the inspection image patch and associated design clip.

There are, however, a number of disadvantages to many of the existing inspection systems and methods. For example, when the methods depend on the accuracy of the inspection system coordinate registration to design, the methods do not necessarily provide the alignment accuracy that is needed. In addition, post-processing alignment on the inspection image patch and associated design clip is dependent on having sufficient information in the inspection patch and design clip. Often, it is the case that this criteria is not met, and the defects concerned cannot be used in the rest of the analysis or worse yet bad data is propagated through the remainder of the analysis thereby reducing the accuracy of the outcome.

Accordingly, it would be advantageous to develop systems and methods for determining coordinates of an area of interest on a specimen that do not have one or more of the disadvantages described above.

SUMMARY OF THE INVENTION

The following description of various embodiments is not to be construed in any way as limiting the subject matter of the appended claims.

One embodiment relates to a system configured to determine coordinates for an area of interest on a specimen. The system includes an inspection subsystem that includes at least an energy source and a detector. The inspection subsystem is configured to scan energy generated by the energy source over specimens while the detector detects energy from the specimens and generates images responsive to the detected energy. The system includes one or more computer subsystems configured for, for an area of interest on another specimen being inspected, identifying one or more targets located closest to the area of interest. The one or more computer subsystems are also configured for aligning one or more images for the one or more targets to a reference for the other specimen. The one or more images for the one or more targets and an image for the area of interest are acquired by the inspection subsystem during inspection of the other specimen. In addition, the one or more targets are configured for determining an offset between the one or more images for the one or more targets and the reference based on results of the aligning and determining modified coordinates of the area of interest based on the offset and coordinates of the area of interest reported by the inspection subsystem. The system may be further configured as described herein.

Another embodiment relates to a method for determining coordinates for an area of interest on a specimen. The method includes, for an area of interest on a specimen being inspected, identifying one or more targets closest to the area of interest. The method also includes aligning one or more images for the one or more targets to a reference for the specimen. The one or more images for the one or more targets and an image for the area of interest are acquired by an inspection system during inspection of the specimen. In addition, the method includes determining an offset between the one or more images for the one or more targets and the reference based on results of the aligning. The method further includes determining modified coordinates of the area of interest based on the offset and coordinates of the area of interest reported by the inspection system. The identifying, aligning, determining the offset, and determining the modified coordinates are performed by one or more computer systems.

Each of the steps of the method described above may be further performed as described further herein. In addition, the embodiment of the method described above may include any other step(s) of any other method(s) described herein. Furthermore, the method described above may be performed by any of the systems described herein.

Another embodiment relates to a non-transitory computer-readable medium storing program instructions executable on a computer system for performing a computer-implemented method for determining coordinates for an area of interest on a specimen. The computer-implemented method includes the steps of the method described above. The computer-readable medium may be further configured as described herein. The steps of the computer-implemented method may be performed as described further herein. In addition, the computer-implemented method for which the program instructions are executable may include any other step(s) of any other method(s) described herein.

BRIEF DESCRIPTION OF THE DRAWINGS

Further advantages of the present invention will become apparent to those skilled in the art with the benefit of the following detailed description of the preferred embodiments and upon reference to the accompanying drawings in which.

Figure 1:
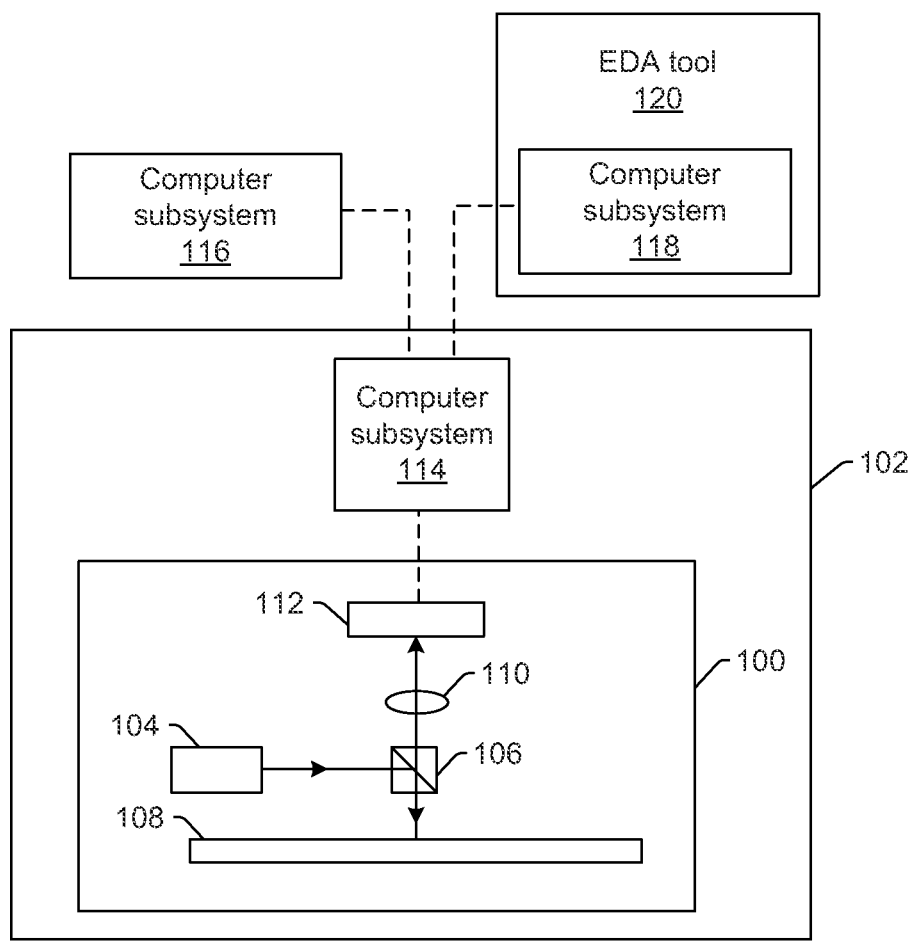
FIGS. 1 and 1a are schematic diagrams illustrating side views of embodiments of a system configured to determine coordinates for an area of interest on a specimen.

While the invention is susceptible to various modifications and alternative forms, specific embodiments thereof are shown by way of example in the drawings and are herein described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

The terms "design" and "design data" as used herein generally refer to the physical design (layout) of an IC and data derived from the physical design through complex simulation or simple geometric and Boolean operations. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data.

In general, however, the design information or data cannot be generated by imaging a wafer with a wafer inspection system. For example, the design patterns formed on the wafer may not accurately represent the design for the wafer and the wafer inspection system may not be capable of generating images of the design patterns formed on the wafer with sufficient resolution such that the images could be used to determine information about the design for the wafer. Therefore, in general, the design information or design data cannot be generated using a physical wafer. In addition, the "design" and "design data" described herein refers to information and data that is generated by semiconductor device designer in a design process and is therefore available for use in the embodiments described herein well in advance of printing of the design on any physical wafers.

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

One embodiment relates to a system configured to determine coordinates for an area of interest on a specimen. The system includes an inspection subsystem that includes at least an energy source and a detector. The inspection subsystem is configured to scan energy generated by the energy source over specimens while the detector detects energy from the specimens and generates images responsive to the detected energy.

In one embodiment, the specimens and the other specimen described herein include wafers. In another embodiment, the specimens and the other specimen described herein include reticles. The wafers and the reticles may include any wafers and reticles known in the art.

In one embodiment, the energy source is a light source, and the energy detected the detector includes light. In this manner, the inspection subsystem may be configured as an optical or light-based inspection subsystem. One embodiment of such an inspection subsystem is shown in FIG. 1 as inspection subsystem 100 of system 102. The inspection subsystem is configured for scanning the specimen with light and detecting light from the specimen during the scanning. For example, as shown in FIG. 1, the inspection subsystem includes light source 104, which may include any suitable light source known in the art. In one example, the light source may be a broadband plasma (BBP) light source, which may be any suitable such light source known in the art. The light that is directed to the specimen may include monochromatic light, polychromatic light, or broadband light.

Light from the light source may be directed to beam splitter 106, which may be configured to direct the light from the light source to specimen 108. The light source may be coupled to any other suitable elements (not shown) such as one or more condensing lenses, collimating lenses, relay lenses, objective lenses, apertures, spectral filters, polarizing components and the like. As shown in FIG. 1, the light may be directed to the specimen at a normal angle of incidence. However, the light may be directed to the specimen at any suitable angle of incidence including near normal and oblique incidence. In addition, the light or multiple light beams may be directed to the specimen at more than one angle of incidence sequentially or simultaneously. The inspection subsystem may be configured to scan the light over the specimen in any suitable manner.

Light from specimen 108 may be collected and detected by one or more detectors of the inspection subsystem during scanning. For example, light reflected from specimen 108 at angles relatively close to normal (i.e., specularly reflected light when the incidence is normal) may pass through beam splitter 106 to lens 110. Lens 110 may include a refractive optical element as shown in FIG. 1. In addition, lens 110 may include one or more refractive optical elements and/or one or more reflective optical elements. Light collected by lens 110 may be focused to detector 112. Detector 112 may include any suitable detector known in the art such as a charge coupled device (CCD) or another type of imaging detector. Detector 112 is configured to generate output that is responsive to the reflected light collected by lens 110. Therefore, lens 110 and detector 112 form one channel of the inspection subsystem. This channel of the inspection subsystem may include any other suitable optical components (not shown) known in the art. The output of the detector may include, for example, images, image data, signals, image signals, or any other output that can be generated by a detector suitable for use in a wafer or reticle inspection system.

Since the inspection subsystem shown in FIG. 1 is configured to detect light specularly reflected from the specimen, the inspection subsystem is configured as a bright field (BF) inspection subsystem. Such an inspection subsystem may, however, also be configured for other types of inspection. For example, the inspection subsystem shown in FIG. 1 may also include one or more other channels (not shown). The other channel(s) may include any of the optical components described herein such as a lens and a detector, configured as a scattered light channel. The lens and the detector may be further configured as described herein. In this manner, the inspection subsystem may also be configured for dark field (DF) inspection.

It is noted that FIG. 1 is provided herein to generally illustrate a configuration of a light-based inspection subsystem that may be included in the system embodiments described herein. Obviously, the inspection subsystem configuration described herein may be altered to optimize the performance of the inspection subsystem as is normally performed when designing a commercial inspection system. In addition, the systems described herein may be implemented using an existing inspection subsystem (e.g., by adding functionality described herein to an existing inspection system) such as the 29xx/28xx series of tools that are commercially available from KLA-Tencor, Milpitas, Calif. For some such systems, the methods described herein may be provided as optional functionality of the system (e.g., in addition to other functionality of the system). Alternatively, the system described herein may be designed "from scratch" to provide a completely new system.

Although the system is described above as being an optical or light-based inspection system, the inspection subsystem may be an electron beam-based subsystem. In one such embodiment, the energy source is an electron beam source, and the energy detected by the detector includes electrons. In one such embodiment shown in FIG. 1a, the inspection subsystem includes electron column 122 coupled to computer subsystem 124.

Figure 1A:
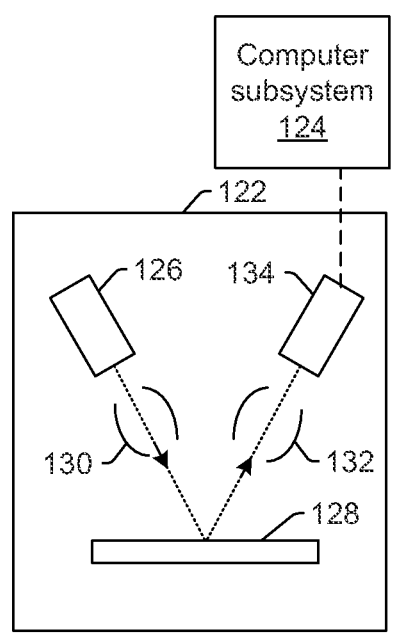

As also shown in FIG. 1a, the electron column includes electron beam source 126 configured to generate electrons that are focused to specimen 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the specimen (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 1a as being configured such that the electrons are directed to the specimen at an oblique angle of incidence and are scattered from the specimen at another oblique angle, it is to be understood that the electron beam may be directed to and scattered from the specimen at any suitable angles.

Computer subsystem 124 may be coupled to detector 134 as described above. The detector may detect electrons returned from the surface of the specimen thereby forming electron beam images of the specimen. The electron beam images may include any suitable electron beam images. Computer subsystem 124 may be configured to detect defects on the specimen using output generated by detector 134. Computer subsystem 124 may be configured to perform any additional step(s) described herein.

It is noted that FIG. 1a is provided herein to generally illustrate a configuration of an electron beam-based inspection subsystem that may be included in the system embodiments described herein. As with the optical inspection subsystem described above, the electron beam-based inspection subsystem configuration described herein may be altered to optimize the performance of the inspection subsystem as is normally performed when designing a commercial inspection system. In addition, the systems described herein may be implemented using an existing inspection subsystem (e.g., by adding functionality described herein to an existing inspection system) such as the eSxxx series of tools that are commercially available from KLA-Tencor, Milpitas, Calif. For some such systems, the methods described herein may be provided as optional functionality of the system (e.g., in addition to other functionality of the system). Alternatively, the system described herein may be designed "from scratch" to provide a completely new system.

The system includes one or more computer subsystems configured for a number of functions described further herein. The computer subsystem(s) may also be referred to herein as computer system(s). The computer subsystem(s) or system(s) may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The subsystem(s) or system(s) may also include any suitable processor known in the art such as a parallel processor. In addition, the subsystem(s) or system(s) may include a computer platform with high speed processing and software, either as a standalone or a networked tool.

The one or more computer subsystems may include a computer subsystem of the inspection system. For example, the one or more computer subsystems may include computer subsystem 114 of inspection system 102 and/or computer subsystem 124 shown in FIG. 1a. Computer subsystem 114 may be coupled to detector 112 and any other detectors of the inspection subsystem such that the computer subsystem can receive output (e.g., images) generated by the detector(s). In a similar manner, computer subsystem 124 may be coupled to detector 134 any other detectors of the inspection subsystem such that the computer subsystem can receive output (e.g., images) generated by the detector(s).

The one or more computer subsystems may also or alternatively include a stand-alone type computer system. For example, as shown in FIG. 1, the one or more computer subsystems may include computer subsystem 116 that is not part of the inspection system or any other system.

The computer subsystem(s) may further include a computer subsystem that is part of an electronic design automation (EDA) tool, and the inspection subsystem described further herein is not part of the EDA tool. For example, as shown in FIG. 1, one of the computer subsystem(s) described above may be computer subsystem 118 included in EDA tool 120. The EDA tool and the computer subsystem included in such a tool may include any commercially available EDA tool that can be configured as described herein. Therefore, the computer subsystem(s) that are configured as described herein may be separate from an inspection system that is used to inspect the specimen.

If the system includes more than one computer subsystem, then the different computer subsystems may be coupled to each other such that images, data, information, instructions, etc. can be sent between the computer subsystems. For example, computer subsystem 114 of the inspection system may be coupled to stand-alone computer subsystem 116 and/or computer subsystem 118 of EDA tool 120 as shown by the dashed lines in FIG. 1 by any suitable transmission media, which may include any suitable wired and/or wireless transmission media known in the art. Two or more of such computer subsystems may also be effectively coupled by a shared computer-readable storage medium (not shown) such as a fab database. If the system includes multiple computer subsystems, then different computer subsystems may be configured to perform different functions described further herein. Alternatively, only one of the computer subsystems shown in FIG. 1 may be configured to perform all of the functions described further herein.

The one or more computer subsystems are configured for, for an area of interest on another specimen being inspected, identifying one or more targets located closest to the area of interest. The embodiments described herein can be used for a number of different types of targets and areas of interest, at least a few of which are described further herein. In general, however, the targets may be patterns (or portions of patterns) in a design for a specimen that are unique with respect to other patterns located proximate to the targets and that have known locations within the design. The areas of interest may be areas of interest that are not known until inspection of the specimen has begun (e.g., when the areas of interest are locations of defects on the specimen). In some such instances, the targets may be known before inspection of the specimen has begun (as when the targets are predefined targets having predefined locations in the design and on the specimen) or may be identified during inspection of the specimen (on the fly as defects are detected). However, the areas of interest may be areas of interest that are known before inspection of the specimen (e.g., when the areas of interest are design-based care areas). In such instances, the targets may also be identified prior to the inspection of the specimen. Therefore, the locations of the areas of interest and the targets may be known prior to image acquisition performed for the specimen during inspection.

In one embodiment, the area of interest is an area on the other specimen in which a defect was detected during the inspection of the other specimen. In one embodiment, the modified coordinates are design space coordinates. In this manner, as described further herein, the embodiments may be configured for generalized post-detection defect alignment-to-design. Numerous use cases such as filtering and sampling are dependent on accurate alignment of inspection data to a design. The embodiments described herein enable post-detection alignment to be substantially accurate irrespective of the content of the inspection image patch and associated design clip that must be aligned. In addition, the embodiments described herein can mitigate the risk of un-align-able or poorly aligned defects (or image locations) to design. The embodiments described herein can also be implemented with modest changes to existing inspection tool software.

In one such embodiment, the one or more computer subsystems identify the one or more targets after the defect has been detected and after image acquisition for the inspection of the other specimen is completed by the inspection subsystem. For example, once a defect has been detected, the computer subsystem(s) may use the location of the detected defect (as determined by the defect detection algorithm and/or method that was used to detect the defect) to determine which of the one or more targets are closest to the detected defect. Since the computer subsystem(s) perform other functions described herein based on image(s) of the target(s) and since, in this embodiment, identifying the one or more targets is performed after image acquisition for the inspection of the other specimen is completed, then, in this embodiment, the targets are preferably known prior to the inspection of the other specimen such that, during the image acquisition performed for the inspection of the other specimen, the images for the targets can be acquired. In this manner, identifying the one or more targets and other functions performed by the computer subsystem(s) based on the identified one or more targets can be performed in post-processing (i.e., the data post-processing that is performed after image acquisition for a specimen has been completed) since the images for the targets can be acquired during the image acquisition and will therefore be available for the post-processing.

In another such embodiment, the one or more computer subsystems identify the one or more targets while image acquisition for the other specimen is being performed for the inspection of the other specimen by the inspection subsystem. For example, once a defect has been detected, the computer subsystem(s) may use the location of the detected defect (as determined by the defect detection algorithm and/or method that was used to detect the defect) to determine which one or more targets are closest to the detected defect. Since the computer subsystem(s) perform other functions described herein based on image(s) of the target(s) and since, in this embodiment, identifying the one or more targets is performed during image acquisition for the inspection of the other specimen, then, in this embodiment, the targets do not need to be known prior to the inspection of the other specimen since, during the image acquisition performed for the inspection of the other specimen, the targets can be identified and then images can be acquired for the identified targets. In this manner, identifying the one or more targets and other functions performed by the computer subsystem(s) based on the identified one or more targets can be performed during the inspection process.

In another embodiment, identifying the one or more targets includes selecting the one or more targets from a set of alignment targets, and the one or more computer subsystems are further configured for aligning the images for the specimens to design information for the specimens to determine design space coordinates of one or more features in the images for the specimens, determining one or more characteristics of results of aligning the images for the specimens, and selecting the set of alignment targets within a design for the other specimen at a frequency across the design determined based on the one or more characteristics.

In one such embodiment, the one or more characteristics are one or more characteristics of errors in the results of aligning the images for the specimens. For example, as shown in step 200 of FIG. 2, the computer subsystem(s) may be configured for characterizing the frequency and degree of inspector image alignment error vs. design to determine the set of alignment targets that will be sufficient. As shown in step 202 of FIG. 2, the computer subsystem(s) may be configured for developing a design rule based search script that will identify potential targets at the determined frequency. In addition, as shown in step 204 of FIG. 2, the computer subsystem(s) may be configured for generating care areas in a specific alignment target care area group at a sufficient number and arrangement of sites.

Figure 3:
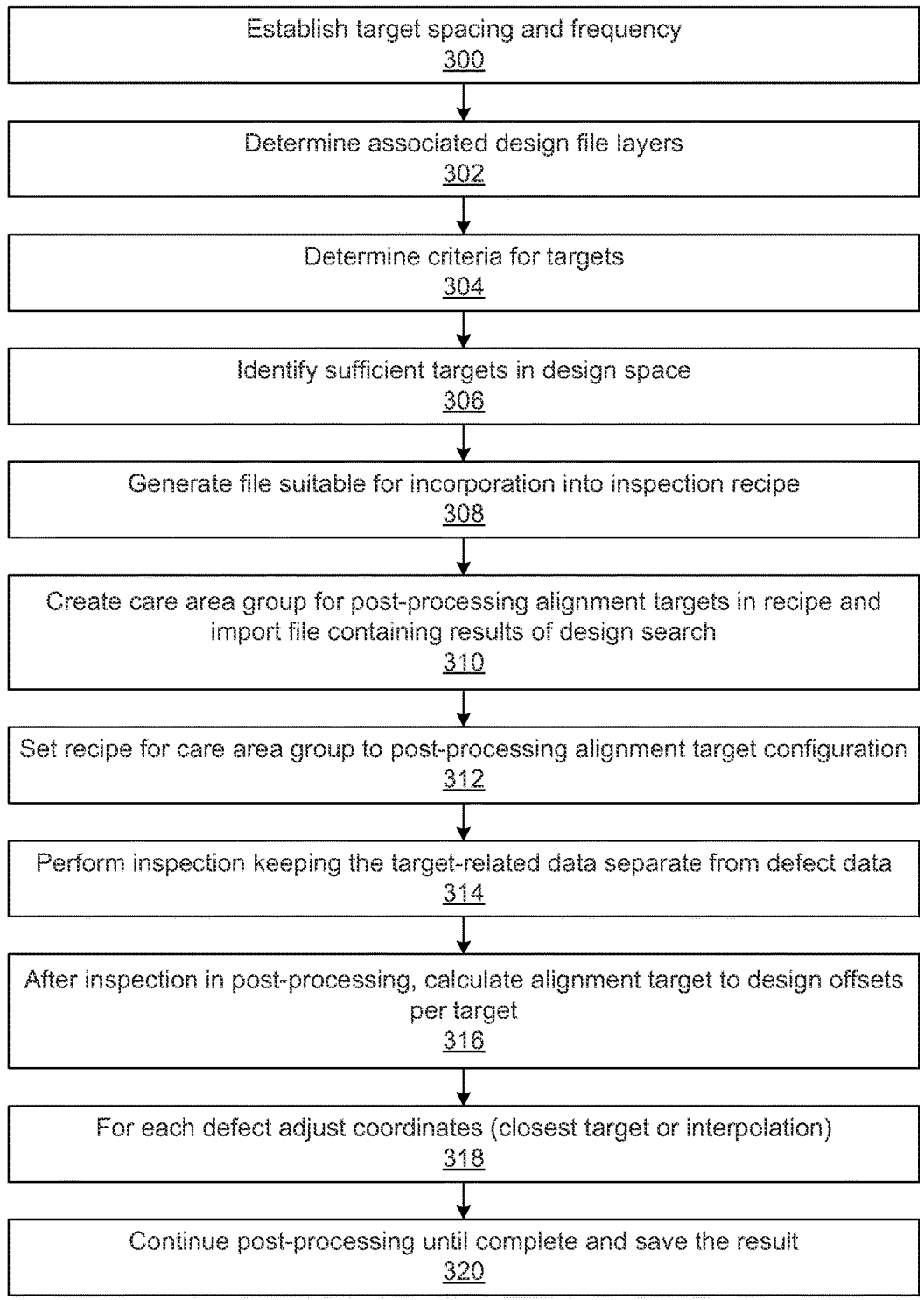

In another example, as shown in step 300 of FIG. 3, the computer subsystem(s) may be configured to establish target spacing and frequency. The computer subsystem(s) may also be configured to determine the associated design file layers, as shown in step 302 of FIG. 3. For example, for each device (e.g., chip) and physical layer (i.e., specimen process layer), the computer subsystem(s) may determine the associated design file layer(s) containing the geometries that are relevant to the inspection imaging method. The computer subsystem(s) may be further configured to determine criteria for the targets as shown in step 304 of FIG. 3. For example, the computer subsystem(s) may translate the criteria for selecting the alignment targets into EDA tool rules for searching the physical design layer(s). The computer subsystem(s) may also be configured to create EDA tool physical design search script to identify sufficient targets within the physical design file. In addition, the computer subsystem(s) may be configured to identify sufficient targets in design space, as shown in step 306 of FIG. 3. For example, the computer subsystem(s) may be configured to run the EDA rule-based search on the physical design file and output the data in a suitable format.

In this manner, the alignment targets can be selected to counterbalance the ability of the inspection system to align images generated by its detectors to a design. For instance, if the frequency and degree of inspector image alignment error vs. design are relatively high and relatively large, respectively, then the alignment targets may be selected at a higher frequency across the design for the specimen. In contrast, if the frequency and degree of inspector image alignment error vs. design are relatively low and relatively small, respectively, then the alignment targets may be selected at a lower frequency across the design for the specimen. In this manner, the alignment targets may be spaced across the design (and therefore the specimen) such that the distance between any one alignment target and any one detected defect is small enough that alignment of the patterns in the alignment target images to the design can be used to substantially accurately correct the alignment of the defect to the design. In addition, the alignment targets may be selected within the design such that they are regularly spaced across the design (e.g., as in a grid) or they may have irregular spacing across the specimen (e.g., as when some areas of the design and therefore the specimen will not be inspected for defects, when defects in some areas of the design and therefore the specimen will not be aligned to the design, when suitable alignment targets are not available at regularly spaced intervals across the design, etc.).

Since images of the alignment targets will be aligned to a reference such as a design and then that alignment result will be used to correct and/or modify other coordinates (e.g., defect coordinates), the alignment targets are preferably selected to include patterns within the design that are unique within some predetermined area on the specimen. A pattern may be unique in a number of different ways such as size and/or shape. In general, a pattern that is unlike any other pattern in the vicinity of the pattern may be suitable for use as an alignment target. Preferably, the alignment target also includes a pattern that can be imaged with sufficient resolution by an inspection system (e.g., a pattern that is unique but cannot be imaged by an inspection system will be largely useless as an alignment target pattern).

In another such embodiment, the one or more computer subsystems are configured for generating a recipe for the inspection of the other specimen such that during the inspection of the other specimen the inspection subsystem acquires the images for the set of alignment targets. A "recipe" can be generally defined in the art as a set of instructions that can be used by a system such as an inspection system to carry out a process such as an inspection process. In some instances, the areas in the design or on the specimen corresponding to the alignment targets may be collectively referred to as an "alignment target care area group" (i.e., a group of areas that are care areas for the purpose of image acquisition but are not necessarily care areas for the purpose of defect detection since defect detection is not necessarily performed in the areas).

Figure 2:
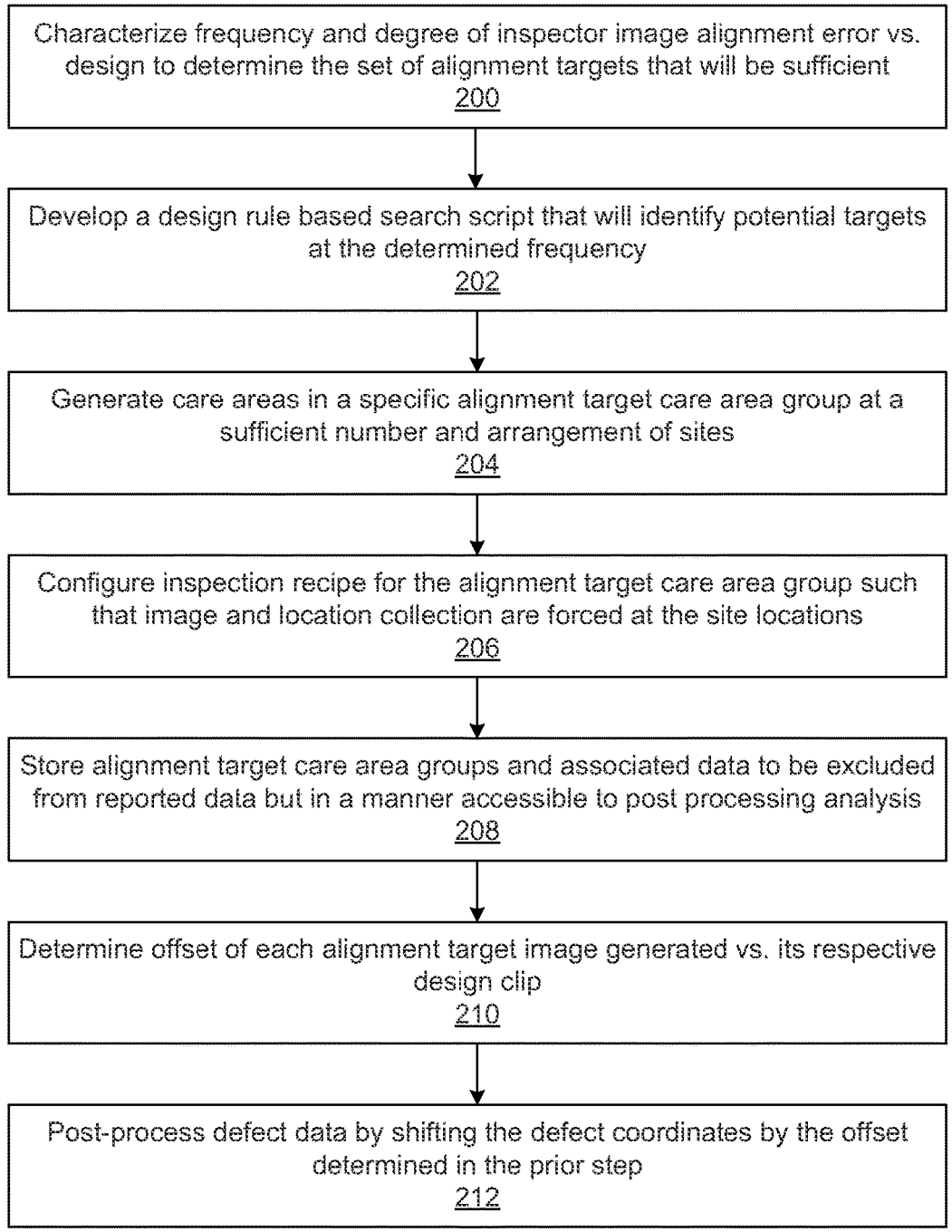
FIGS. 2-3 are flow charts illustrating different embodiments of steps that may be performed by the systems described herein.

In one example, as shown in step 206 of FIG. 2, the computer subsystem(s) may be configured for configuring (setting up and/or altering) an inspection recipe for the alignment target care area group such that image and location collection are forced at the site locations. In addition, as shown in step 308 of FIG. 3, the computer subsystem(s) may be configured to generate a file suitable for incorporation into an inspection recipe. For example, the computer subsystem(s) may be configured to determine, based on the inspection system type or model, the appropriate method for associating (or including) the alignment target care areas with (or in) the inspection recipe. As further shown in step 310 of FIG. 3, the computer subsystem(s) may be configured for creating a care area group for post-processing alignment targets (i.e., alignment targets to be used in post-processing)

in recipe (the inspection recipe) and importing the file containing the results of the design search (into the inspection recipe).

The computer subsystem(s) may also be configured to set the recipe for the care area group to post-processing alignment target configuration, as shown in step 312 of FIG. 3. In this manner, no data processing may be performed on the images acquired for the alignment targets until after the image acquisition for the specimen has been completed. In other words, the recipe may be set such that, for the alignment target care area group, the inspection subsystem is forced to acquire images at the locations of the alignment targets on the specimen. In this manner, images may be acquired at locations on the specimen other than defect locations (i.e., the alignment target locations) and then stored in order to reliably obtain reference target images for alignment of any defect to design.

In an additional such embodiment, the one or more computer subsystems are further configured for storing the images for the set of alignment targets such that the stored images are available for use after scanning of the other specimen performed during the inspection of the other specimen has been completed. The images for the set of alignment targets may be stored in any suitable manner such that they are available for such use. In this manner, the alignment target images may be available for data processing that is performed post specimen image acquisition.

In some such embodiments, the inspection subsystem acquires images at other locations on the other specimen to be inspected for defects detected during the inspection, the one or more computer subsystems are configured for detecting the defects on the other specimen based on the images for the other specimen acquired at the other locations, and detecting the defects includes determining positions of the defects. Detecting defects on the specimen may include applying one or more defect detection algorithms to images or other output of the detector(s) of the inspection subsystem. Applying the defect detection algorithm(s) to the images or output may be performed in a number of different ways and in any suitable manner known in the art. In addition, applying the defect detection algorithm(s) to the images or output may be performed using any method, algorithm, function, data structure, etc. known in the art of data, signal, or image processing. The defect detection method and/or algorithm that is used by the computer subsystem(s) to detect the defects may also output the positions of the detected defects on the specimen. The positions of the detected defects that are outputted by the defect detection method and/or algorithm may be then be reported by the inspection subsystem (e.g., by including the coordinates of the positions of the detected defects in inspection results generated and stored by the inspection subsystem).

In another such embodiment, detecting the defects is not performed based on the images for the set of alignment targets. For example, as shown in step 314 of FIG. 3, the computer subsystem(s) may be configured to perform the inspection keeping the target-related data separate from the defect data. Therefore, any defect detection algorithm and/or method performed by the computer subsystem(s) can be performed using the images acquired for the portions of the specimen that are to be inspected for defects as input without also using the images acquired for the alignment targets as input.

In a further such embodiment, selecting the set of alignment targets is performed by the one or more computer subsystems prior to the inspection of the other specimen. For example, as noted above, in some instances, the set of alignment targets may be selected based on the ability of the inspection system to align images acquired by the inspection system to a design. Since that information may be determined prior to performing an inspection on a specimen, the set of alignment targets can be selected prior to inspection of that specimen.

In another embodiment, selecting the set of alignment targets is performed by the one or more computer subsystems during the inspection of the other specimen and after at least one of the defects is detected. For example, the embodiments may be configured to search for suitable alignment targets in the output of the inspection subsystem based on the detected defects. Such searching may be performed as described in U.S. Patent Application Publication Serial No. 2014/0376801 by Karsenti et al. published on Dec. 25, 2014, which is incorporated by reference as if fully set forth herein. The embodiments described herein may include any step(s) of any method(s) described in this publication and the systems described herein may be further configured as described in this publication. In this manner, the locations at which alignment target image generation is performed may be generated on the fly (e.g., by identifying a "rough" location of a defect in a design and then searching the design proximate to that location for suitable alignment target(s) or by performing image acquisition in the area on the specimen proximate to the detected defect location and then searching the acquired images for suitable alignment target(s)). Thus, rather than generating a set of alignment targets in advance of the inspection, the targets at which images are generated may be triggered by the detection of defects. Such an implementation can leverage the fast design search tool described in the patent application publication incorporated by reference above.

In an additional embodiment, the one or more computer subsystems are configured for storing the images for the set of alignment targets such that the stored images are available for use after scanning of the other specimen performed during the inspection of the other specimen has been completed and such that the stored images are stored separately from results of detecting the defects. For example, as shown in step 208 of FIG. 2, the computer subsystem(s) may be configured for storing aligning target care area groups and associated data to be excluded from reported defect data but in a manner accessible to post-processing analysis. Such storing may be performed in any suitable manner.

The one or more computer subsystems are also configured for aligning one or more images for the one or more targets to a reference for the other specimen. The one or more images for the one or more targets and an image for the area of interest are acquired by the inspection subsystem during inspection of the other specimen. In general, any method or system that can be used to align two patterns to each other, at least one of which is a pattern in an image generated by an inspection system, can be used for such aligning. Aligning the image(s) for the targets to a reference may also be performed as described in the patents by Zafar et al. and Kulkarni et al. that are incorporated by reference above as if fully set forth herein. The embodiments may include any other step(s) of any method(s) described in these patents and the systems described herein may be further configured as described in these patents.

The one or more computer subsystems are also configured for determining an offset between the one or more images for the one or more targets and the reference based on results of the aligning and determining modified coordinates of the area of interest based on the offset and coordinates of the area of interest reported by the inspection subsystem. In one embodiment, the area of interest is a position of a first of the detected defects, the reference is the design for the other specimen, the offset is an alignment target-to-design offset, and determining the modified coordinates includes applying the alignment target-to-design offset to the reported coordinates of the first detected defect to thereby determine design space coordinates for the first detected defect.

In one such example, as shown in step 210 of FIG. 2, the computer subsystem(s) may be configured for determining an offset of each alignment target image generated vs. its respective design clip. In addition, as shown in step 212 of FIG. 2, the computer subsystem(s) may be configured to post-process defect data by shifting the defect coordinates by the offset determined in the prior step. For best results, the offsets may be determined for two or more alignment targets proximate (or surrounding) the defect position and the offsets of the two or more alignment targets may be interpolated to determine the appropriate offset for the defect. The offset can be a simple one-dimensional offset or a more complex offset that involves scaling, rotation, warp, or another non-linear transformation. Any of these transformation offsets can be derived from the alignment of alignment target images to the reference images (typically derived from physical design clips) as described further herein. In addition, the offsets determined as described herein may only be relevant for the specimen for which the images described herein were acquired and then used by the computer subsystem(s) for aligning to the reference.

In another example, as shown in step 316 of FIG. 3, after inspection in post-processing, the computer subsystem(s) may be configured to calculate alignment target-to-design offsets per target (for each or one or more alignment targets). In addition, as shown in step 318 of FIG. 3, for each defect, the computer subsystem(s) may be configured to adjust its coordinates using a correction determined from the closest alignment target or by interpolation based on data from multiple targets. The computer subsystem(s) may also be configured to continue with post-processing until complete and save the result, as shown in step 320 of FIG. 3.

The computer subsystem(s) may be configured to align the one or more images for the one or more targets to the reference, determine the offset, and determine the modified coordinates of the area of interest in specimen post-processing (e.g., the data processing that is performed after all image acquisition that is to be performed during an inspection recipe has been completed). However, the computer subsystem(s) may be configured to do the alignment corrections at run time. For example, the computer subsystem(s) may be configured to align the one or more images for the one or more targets to the reference, determine the offset, and determine the modified coordinates of the area of interest during image acquisition that is performed during the inspection recipe. This implementation may take more work than an implementation in which the steps are performed in post-processing, but this implementation can have additional benefits for detection sensitivity.

The results of the embodiments described herein can optionally be saved for further analysis depending on the use case. For example, the resulting data can be fed to additional post-processing steps such as extraction of design attribute(s), image attribute(s), or difference image attribute(s) to be added to the defect results for use in filtering, sampling, classification, etc. algorithms and/or methods. In another embodiment, the area of interest is a position of a first of the detected defects, and the one or more computer subsystems are configured for sending the image of the area of interest with one or more portions of the design corresponding to the one or more targets located closest to the area of interest to a defect review tool configured to use the one or more portions of the design to relocate the area of interest in a field of view of the defect review tool. For example, the design clip for the alignment target may be stored as part of the lot result that goes to an electron beam review platform, which can then use the design clip to accurately relocate the portion of the specimen in the scanning electron microscope (SEM) field of view that represents the location of the defect (or location of interest) in the image from the inspection system. Other types of defect review tools may be configured to relocate defects in a similar manner using design information for the alignment targets closest to a location of a defect selected for review.

In one embodiment, the area of interest is a care area on the other specimen. For example, the embodiments described herein may be configured to move (or offset) a design-based care area after pattern search (i.e., moving or locating a care area after a designated pattern has been searched for and found), which is advantageous since having only "enlarge" and "reduce" options may not be sufficient to cover certain areas of design-based care areas. Therefore, currently available shrink/grow options may not be enough to generate design-based care areas in the correct position. The embodiments described herein are also different than methods that register a design-based care area in a main user interface since doing so in the main user interface generally moves all of the design-based care areas for a specimen instead of only one design-based care area group.

In addition, such currently used methods are unable to move only one design-based care area. In contrast, the embodiments described herein can be used to identify and/or correct the coordinates of a design-based care area on a care area-by-care area basis or on a care area group-by-care area group basis.

The term "design-based care area" as used herein can be generally defined as a care area that is identified in a design for a specimen and is identified in inspection system output for the specimen by aligning the design for the care area to the specimen. Therefore, the design-based care areas described herein are different than other care areas that may be determined based on the inspection system output for the specimen and not necessarily the design for the specimen. For example, a care area that is not design-based may be based on noise in output of the inspection system and/or a location of the specimen that is not necessarily design-based (e.g., a location determined based on a corner of a die visible in the output of the inspection system for a specimen). In contrast, the design-based care areas as described herein are design-based in that they can be identified by aligning design information for the specimen to the output of the inspection system for the specimen. Since the design-based care areas can be located in such a manner, the care areas can be identified in the output much more accurately than other care areas and the care areas can have a much smaller size than other care areas.

However, not all design-based care areas necessarily contain patterns that are unique with respect to other patterns on a specimen, and/or defects that are present in the design-based care areas can make aligning the design information to the inspection system output difficult.

The embodiments described herein alleviate such difficulties by associating design-based care areas with other patterns located nearby that: 1) are unique relative to other patterns in the same vicinity, 2) have a predetermined spatial relationship with the design-based care area, 3) are relatively robust in that they can more often than not be formed on a specimen with a relatively high degree of accuracy, and 4) can be resolved sufficiently in the inspection system output. Then, as described further herein, once the other patterns have been aligned to the design information for those patterns, the predetermined spatial relationship between those patterns and the design-based care area can be used to identify the design-based care area in the inspection system output. Therefore, although the output for the design-based care area itself may not be aligned to the design, the design-based care area is effectively aligned to the design by virtue of the alignment of the other predetermined patterns to design.

In some embodiments, the care area does not include unique patterns within a design for the other specimen, and the one or more computer subsystems are configured for selecting one or more unique patterns within the design closest to the area of interest for use as the one or more targets. In this manner, the embodiments described herein enable a design-based care area to be used even if the actual care area does not, in of itself, contain a unique pattern but always occurs relatively close to a unique pattern. In other words, by identifying one or more patterns in the design that have a predetermined spatial relationship with a design-based care area and are unique relative to other nearby patterns, a design-based care area that otherwise could not be identified in inspection system output, because it does not contain unique patterns, can be identified by virtue of its spatial relationship to the identified one or more unique patterns, once those identified pattern(s) have been aligned to design. Selecting the one or more unique patterns may be performed by identifying a pattern of interest (POI), searching for the POI location in a pattern search performed on the design for the other specimen, and then determining the design-based care areas having a particular offset for the POI.

In another embodiment, the care area is an area in which a weak point within a design for the other specimen is located. For example, the one or more targets can be selected as certain unique patterns in the design and then based on the location of the one or more targets and the spatial relationship between the one or more targets and the design-based care area, the design-based care area can be moved to a weak point (i.e., a "hot spot") location, which can be affected easily by the semiconductor process(es) performed on the specimen. In this manner, even if the design-based care area tends to be formed improperly on the specimen, that susceptibility to incorrect patterning may not prevent the design-based care area from being correctly identified in the inspection system output. Therefore, the embodiments described herein may be particularly advantageous for use with design-based care areas that correspond to weak points in the design. Weak points in a design are described further in U.S. Patent Application Publication No. 2015/0012900 published Jan. 8, 2015 by Shifrin, which is incorporated by reference as if fully set forth herein. The embodiments described herein may be further configured as described in this patent application publication.

In a further embodiment, the care area is located within a memory area of a design for the other specimen. For example, the embodiments described herein can enable memory fabs to adopt more inspection recipes that use design-based care areas. In particular, there are many similar patterns within memory areas of devices fabricated in memory fabs, which may make it relatively difficult to draw correct weak point regions for design-based care areas without the embodiments described herein. Accordingly, the embodiments described herein allow memory fabs to adopt design-based care areas for more layers.

Figure 4:
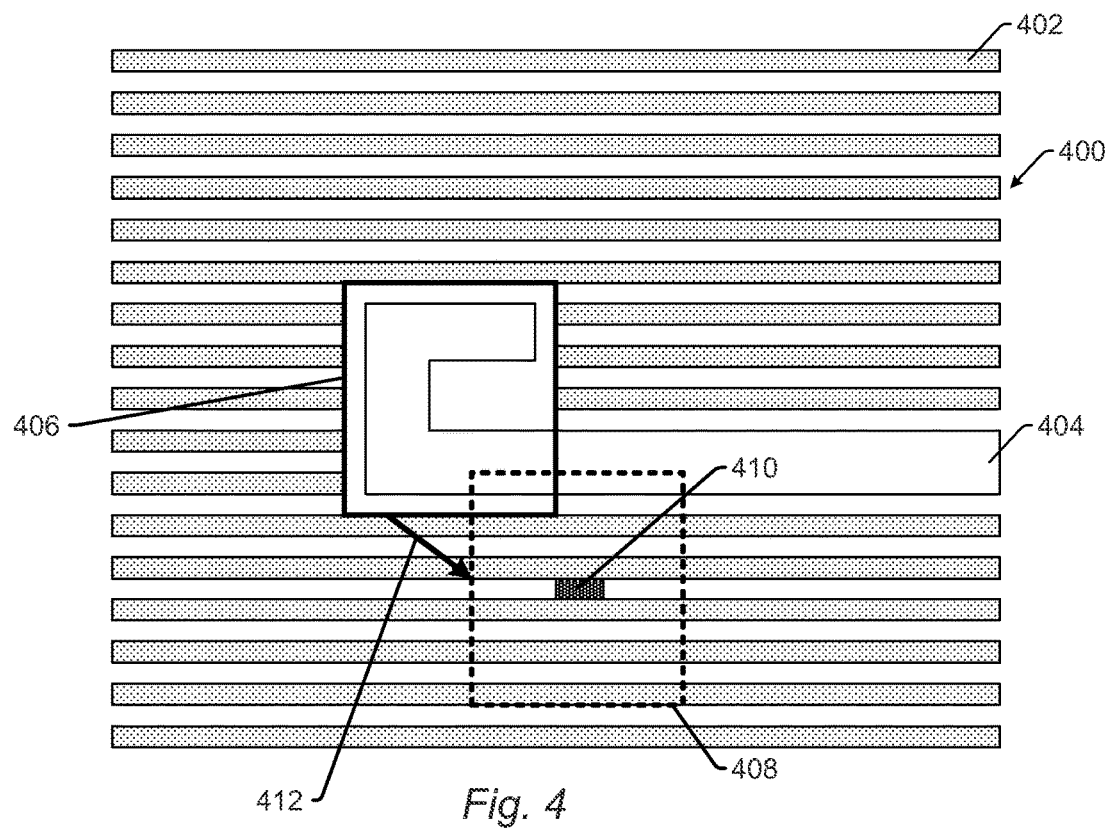
FIG. 4 is a schematic diagram illustrating a plan view of one embodiment of a target on a specimen and an area of interest on the specimen.

In some embodiments, the modified coordinates of the image of the care area are determined based on the offset between the one or more images for the one or more targets and the reference and a predetermined offset between the one or more targets and the care area. FIG. 4 illustrates one example of patterns on a specimen that can be used by the computer subsystem(s) to perform such determinations of the coordinates. For example, as shown in FIG. 4, a substantial number of the patterns in area 400 on a specimen (not shown in FIG. 4) are substantially the same (e.g., the patterns largely include lines 402 that have substantially similar characteristics such as linewidth and spacing from other lines). However, if the area includes a pattern that has one or more unique characteristics such as feature 404 that has a different shape and different dimensions than all other lines in the area of the specimen, that feature or a portion thereof can be designated as the one or more targets. For instance, in the example shown in FIG. 4, the portion of the feature in area 406 may be designated as a target for this area on the specimen. In particular, area 406 may be designated as a POI search region by a pattern search of the design for the area of the specimen shown in FIG. 4. In this manner, if there is a design-based care area in the same area of the specimen that has a particular spatial relationship with the portion of the feature in area 406, that design-based care area can be located on the specimen by identifying area 406 in inspection system output (e.g., images) and then using that spatial relationship in combination with the location of area 406 in the inspection system output to determine the position of the design-based care area in the inspection system output. For example, in area 400 shown in FIG. 4, there may be design-based care area 408, which may be selected as a care area because it is a region in area 400 in which defect of interest (DOI) 410 may be present, and which has a particular spatial relationship with area 406 as shown schematically in this figure by arrow 412. Therefore, the embodiments described herein can use this spatial relationship (or offset) to determine the exact (or substantially exact) design-based care area within the inspection system output whereas if determination of the design-based care area location is attempted with the patterns located in the design-based care area, the design-based care area could not be located accurately due to the lack of unique patterns within the design-based care area. In this manner, the embodiments described herein advantageously provide the ability to identify the position of the design-based care areas more accurately than previously used methods and systems.

In another embodiment, the one or more targets are used for determining modified coordinates of images of different care areas on the other specimen having different predetermined offsets between the one or more targets and the different care areas. For example, each POI can be associated with different design-based care areas and different offsets for each of the design-based care areas. In one such example, if a target is defined by the portion of the feature in area 406 shown in FIG. 4, then if the target has different predetermined offsets (e.g., different in direction and/or dimension) between itself and more than one design-based care area, then that same target can be used to determine the position of design-based care area 408 and any of the other design-based care areas (not shown in FIG. 4).

Selecting the one or more targets that are used for design-based care areas may also be performed as described further herein such that the one or more targets that are selected and used for any one or more design-based care areas are identified based on the ability of the inspection system to align its output to a design for a specimen. In particular, the one or more targets for a design-based care area may be selected based on the frequency and degree of error in results of inspection system output-to-design alignment that is performed by the inspection system. In this manner, the distance between a target and its associated area of interest may be small enough that the error in the alignment performed by the inspection system will not cause any (or at least not significant) error in the determined position of the design-based care area. Furthermore, more than one target, possibly with interpolation, may be used to determine the position of any one design-based care area as described further herein.

In one embodiment, the coordinates determined for the image of the care area are specimen space coordinates (i.e., wafer space coordinates or reticle space coordinates). In another embodiment, the coordinates determined for the image of the care area are design space coordinates. For instance, after the design-based care area has been located in the inspection system output as described further herein, the position of the care area may be reported as the specimen space coordinates determined by the inspection system for the inspection system output that corresponds to the design-based care area. Alternatively, once the design-based care area has been located in the inspection system output as described herein, the design coordinates corresponding to the care area may be assigned to its inspection system output. Of course, both types of coordinates may also be assigned to the inspection system output, which may be useful for relocation of the design-based care area in the specimen (wafer or reticle) space (e.g., by the same inspection system) and for performing other design-based functions (e.g., filtering, classification, etc.) in the design space.

The embodiments described herein may also be configured as described in U.S. Patent Application Ser. No. 62/073,418 filed on Oct. 31, 2014 by Duffy, which is incorporated by reference as if fully set forth herein. The embodiments described herein may also be configured to perform any steps of any methods described in this patent application.

Each of the embodiments of the system described above may be combined together into one single embodiment. In other words, unless otherwise noted herein, none of the system embodiments are mutually exclusive of any other system embodiments. Furthermore, although FIGS. 2 and 3 show a variety of functions that may be performed by the computer subsystem(s) described herein, unless otherwise noted herein, none of the functions shown in these figures are essential to the function of the system embodiments described herein and/or practice of the method embodiments described herein. In other words, the embodiments described herein may be configured to perform fewer than all of the functions shown in these figures or more than all of the functions shown in these figures, and the embodiments can still function and/or be practiced within the scope of these embodiments.

Another embodiment relates to a method for determining coordinates for an area of interest on a specimen. The method includes, for an area of interest on a specimen being inspected, identifying one or more targets located closest to the area of interest. The method also includes aligning one or more images for the one or more targets to a reference for the specimen. The one or more images for the one or more targets and an image for the area of interest are acquired by an inspection system during inspection of the specimen. In addition, the method includes determining an offset between the one or more images for the one or more targets and the reference based on results of the aligning. The method further includes determining modified coordinates of the area of interest based on the offset and coordinates of the area of interest reported by the inspection system.

Each of the steps of the method may be performed as described further herein. The method may also include any other step(s) that can be performed by the inspection subsystem and/or computer subsystem(s) described herein. The identifying, aligning, determining the offset, and determining the modified coordinates steps are performed by one or more computer systems, which may be configured according to any of the embodiments described herein. In addition, the method described above may be performed by any of the system embodiments described herein.

Although the embodiments are described herein with respect to scanning of a physical specimen with an inspection system, any of the embodiments described herein may be implemented using a so-called "virtual inspector" such as the systems and methods described in commonly assigned U.S. Pat. No. 8,126,255 issued on Feb. 28, 2012 to Bhaskar et al., U.S. Patent Application Publication No. 2014/0241610 by Duffy et al. published on Aug. 28, 2014, and U.S. patent application Ser. No. 14/803,872 by Duffy et al. filed on Jul. 20, 2015, all of which are incorporated by reference as if fully set forth herein. In other words, in some embodiments, the inspection system is configured as a virtual inspection system. In these embodiments, the output of the one or more detectors may be output that was previously generated by one or more detectors of an optical or electron beam inspection system and that is stored in the virtual inspection system, and during the scanning, the virtual inspection system may replay the stored output as though the specimen is being scanned. In this manner, scanning the specimen with a virtual inspection system may appear to be the same as though a physical specimen is being scanned with an actual inspection system, while, in reality, the scanning involves simply replaying output for the specimen in the same manner as the specimen may be scanned. The embodiments described herein may be further configured as described in the patent and patent applications incorporated by reference above.

Figure 5:
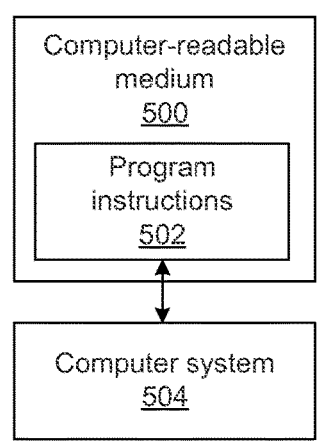
FIG. 5 is a block diagram illustrating one embodiment of a non-transitory computer-readable medium storing program instructions for causing a computer system to perform a computer-implemented method described herein.

An additional embodiment relates to a non-transitory computer-readable medium storing program instructions executable on a computer system for performing a computer-implemented method for determining coordinates for an area of interest on a specimen. One such embodiment is shown in FIG. 5. In particular, as shown in FIG. 5, non-transitory computer-readable medium 500 includes program instructions 502 executable on computer system 504. The computer-implemented method may include any step(s) of any method(s) described herein.

Program instructions 502 implementing methods such as those described herein may be stored on computer-readable medium 500. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 504 may be configured according to any of the embodiments described herein.

Further modifications and alternative embodiments of various aspects of the invention will be apparent to those skilled in the art in view of this description. For example, methods and systems for determining coordinates for an area of interest on a specimen are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to determine coordinates for an area of interest on a specimen, comprising:
   an inspection subsystem comprising at least an energy source and a detector, wherein the inspection subsystem is configured to scan energy generated by the energy source over specimens while the detector detects energy from the specimens and generates images responsive to the detected energy; and
   one or more computer subsystems configured for:
      for an area of interest on another specimen being inspected, identifying one or more targets located closest to the area of interest, wherein the one or more targets comprise one or more patterns in a design for the other specimen that are unique with respect to other patterns located proximate to the one or more targets, and wherein the one or more patterns in the one or more targets are different than patterns in the area of interest;
      aligning one or more images for the one or more targets to a reference for the other specimen, wherein the one or more images for the one or more targets and an image for the area of interest are acquired by the inspection subsystem during inspection of the other specimen;
      determining an offset between the one or more images for the one or more targets and the reference based on results of said aligning; and
      determining modified coordinates of the area of interest based on the offset and coordinates of the area of interest reported by the inspection subsystem.

2. The system of claim 1, wherein the area of interest is an area on the other specimen in which a defect was detected during the inspection of the other specimen.

3. The system of claim 1, wherein the area of interest is an area on the other specimen in which a defect was detected during the inspection of the other specimen, and wherein the one or more computer subsystems identify the one or more targets after the defect has been detected and after image acquisition for the inspection of the other specimen is completed by the inspection subsystem.

4. The system of claim 1, wherein the area of interest is an area on the other specimen in which a defect was detected during the inspection of the other specimen, and wherein the one or more computer subsystems identify the one or more targets while image acquisition for the other specimen is being performed for the inspection of the other specimen by the inspection subsystem.

5. The system of claim 1, wherein the modified coordinates are design space coordinates.

6. The system of claim 1, wherein identifying the one or more targets comprises selecting the one or more targets from a set of alignment targets, and wherein the one or more computer subsystems are further configured for aligning the images for the specimens to design information for the specimens to determine design space coordinates of one or more features in the images for the specimens, determining one or more characteristics of results of said aligning the images for the specimens, and selecting the set of alignment targets within the design for the other specimen at a frequency across the design determined based on the one or more characteristics.

7. The system of claim 6, wherein the one or more characteristics are one or more characteristics of errors in the results of said aligning the images for the specimens.

8. The system of claim 6, wherein the one or more computer subsystems are further configured for generating a recipe for the inspection of the other specimen such that during the inspection of the other specimen the inspection subsystem acquires the images for the set of alignment targets.

9. The system of claim 8, wherein the one or more computer subsystems are further configured for storing the images for the set of alignment targets such that the stored images are available for use after scanning of the other specimen performed during the inspection of the other specimen has been completed.

10. The system of claim 8, wherein the inspection subsystem further acquires images at other locations on the other specimen to be inspected for defects during the inspection, wherein the one or more computer subsystems are further configured for detecting the defects on the other specimen based on the images for the other specimen acquired at the other locations, and wherein detecting the defects comprises determining positions of the defects.

11. The system of claim 10, wherein detecting the defects is not performed based on the images for the set of alignment targets.

12. The system of claim 10, wherein selecting the set of alignment targets is performed by the one or more computer subsystems prior to the inspection of the other specimen.

13. The system of claim 10, wherein selecting the set of alignment targets is performed by the one or more computer subsystems during the inspection of the other specimen and after at least one of the defects is detected.

14. The system of claim 10, wherein the one or more computer subsystems are further configured for storing the images for the set of alignment targets such that the stored images are available for use after scanning of the other specimen performed during the inspection of the other specimen has been completed and such that the stored images are stored separately from results of said detecting the defects.

15. The system of claim 10, wherein the area of interest is a position of a first of the detected defects, wherein the reference is the design for the other specimen, wherein the offset is an alignment target-to-design offset, and wherein determining the modified coordinates comprises applying the alignment target-to-design offset to the reported coordinates of the first detected defect to thereby determine design space coordinates for the first detected defect.

16. The system of claim 10, wherein the area of interest is a position of a first of the detected defects, and wherein the one or more computer subsystems are further configured for sending the image of the area of interest with one or more portions of the design corresponding to the one or more targets located closest to the area of interest to a defect review tool configured to use the one or more portions of the design to relocate the area of interest in a field of view of the defect review tool.

17. The system of claim 1, wherein the area of interest is a care area on the other specimen.

18. The system of claim 17, wherein the patterns in the care area do not comprise unique patterns within the design for the other specimen, and wherein the one or more computer subsystems are further configured for selecting the one or more patterns that are unique within the design closest to the area of interest for use as the one or more targets.

19. The system of claim 17, wherein the care area is an area in which a weak point within the design for the other specimen is located.

20. The system of claim 17, wherein the care area is located within a memory area of the design for the other specimen.

21. The system of claim 17, wherein the modified coordinates of the image of the care area are further determined based on the offset between the one or more images for the one or more targets and the reference and a predetermined offset between the one or more targets and the care area.

22. The system of claim 17, wherein the one or more targets are used for determining modified coordinates of images of different care areas on the other specimen having different predetermined offsets between the one or more targets and the different care areas.

23. The system of claim 17, wherein the modified coordinates determined for the image of the care area are specimen space coordinates.

24. The system of claim 17, wherein the modified coordinates determined for the image of the care area are design space coordinates.

25. The system of claim 1, wherein the specimens and the other specimen comprise wafers.

26. The system of claim 1, wherein the specimens and the other specimen comprise reticles.

27. The system of claim 1, wherein the energy source is a light source, and wherein the energy detected by the detector comprises light.

28. The system of claim 1, wherein the energy source is an electron beam source, and wherein the energy detected by the detector comprises electrons.

29. A non-transitory computer-readable medium, storing program instructions executable on a computer system for performing a computer-implemented method for determining coordinates for an area of interest on a specimen, wherein the computer-implemented method comprises:

for an area of interest on a specimen being inspected, identifying one or more targets located closest to the area of interest, wherein the one or more targets comprise one or more patterns in a design for the other specimen that are unique with respect to other patterns located proximate to the one or more targets, and wherein the one or more patterns in the one or more targets are different than patterns in the area of interest;

aligning one or more images for the one or more targets to a reference for the specimen, wherein the one or more images for the one or more targets and an image for the area of interest are acquired by an inspection system during inspection of the specimen;

determining an offset between the one or more images for the one or more targets and the reference based on results of said aligning; and determining modified coordinates of the area of interest based on the offset and coordinates of the area of interest reported by the inspection system.

30. A method for determining coordinates for an area of interest on a specimen, comprising:

for an area of interest on a specimen being inspected, identifying one or more targets located closest to the area of interest, wherein the one or more targets comprise one or more patterns in a design for the other specimen that are unique with respect to other patterns located proximate to the one or more targets, and wherein the one or more patterns in the one or more targets are different than patterns in the area of interest;

aligning one or more images for the one or more targets to a reference for the specimen, wherein the one or more images for the one or more targets and an image for the area of interest are acquired by an inspection system during inspection of the specimen;

determining an offset between the one or more images for the one or more targets and the reference based on results of said aligning; and determining modified coordinates of the area of interest based on the offset and coordinates of the area of interest reported by the inspection system, wherein said identifying, said aligning, said determining the offset, and said determining the modified coordinates are performed by one or more computer systems.

* * * * *